(12) United States Patent
Kanarik

(10) Patent No.: US 10,121,639 B2
(45) Date of Patent: *Nov. 6, 2018

(54) MIXED MODE PULSING ETCHING IN PLASMA PROCESSING SYSTEMS

(71) Applicant: Lam Research Corporation, Fremont, CA (US)

(72) Inventor: Keren Jacobs Kanarik, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 15/209,682

(22) Filed: Jul. 13, 2016

(65) Prior Publication Data

US 2016/0322201 A1 Nov. 3, 2016

Related U.S. Application Data

(60) Continuation of application No. 14/510,866, filed on Oct. 9, 2014, now Pat. No. 9,425,025, which is a (Continued)

(51) Int. Cl.
*H01L 21/302* (2006.01)
*H01J 37/32* (2006.01)

(52) U.S. Cl.
CPC .. *H01J 37/32082* (2013.01); *H01J 37/32146* (2013.01); *H01J 37/32155* (2013.01);
(Continued)

(58) Field of Classification Search
CPC .............. A61K 39/00; A61K 2039/522; A61K 2039/523; C12N 15/74; C12N 9/1241;
(Continued)

(56) References Cited

U.S. PATENT DOCUMENTS 7,166,233 B2   1/2007   Johnson et al. ................. 216/67
7,569,491 B2 *  8/2009   Faguet ................ B81C 1/00071
                                                               216/99

(Continued)

OTHER PUBLICATIONS

Chinese App. No. 201610451176.8, Office Action 200433, issued by Chinese Patent Office, dated Sep. 15, 2017.

*Primary Examiner* — Lan Vinh
(74) *Attorney, Agent, or Firm* — Martine Penilla Group, LLP

(57) ABSTRACT

A method for processing substrate in a chamber, which has at least one plasma generating source, a reactive gas source for providing reactive gas into the interior region of the chamber, and a non-reactive gas source for providing non-reactive gas into the interior region, is provided. The method includes performing a mixed-mode pulsing (MMP) preparation phase, including flowing reactive gas into the interior region and forming a first plasma to process the substrate that is disposed on a work piece holder. The method further includes performing a MMP reactive phase, including flowing at least non-reactive gas into the interior region, and forming a second plasma to process the substrate, the second plasma is formed with a reactive gas flow during the MMP reactive phase that is less than a reactive gas flow during the MMP preparation phase. Perform the method steps a plurality of times.

20 Claims, 11 Drawing Sheets

Related U.S. Application Data division of application No. 13/550,548, filed on Jul. 16, 2012, now Pat. No. 8,883,028.

(60) Provisional application No. 61/581,054, filed on Dec. 28, 2011.

(52) U.S. Cl.
CPC ... *H01J 37/32449* (2013.01); *H01J 37/32174* (2013.01); *H01J 2237/334* (2013.01)

(58) Field of Classification Search
CPC ........... H01J 2237/334; H01J 37/32082; H01J 37/32146; H01J 37/32155; H01J 37/32449; H01J 2237/341; H01J 37/32174; H01J 37/32137; C23C 16/0245
USPC ....... 438/745, 753, 756, 757, 770, 706, 712, 438/714, 717, 719
See application file for complete search history.

(56) References Cited

U.S. PATENT DOCUMENTS

| | | | | |
|---|---|---|---|---|
| 8,883,028 B2 * | 11/2014 | Kanarik | ............ | H01J 37/32082 216/68 |
| 2002/0160125 A1 * | 10/2002 | Johnson | ............ | H01J 37/32082 427/569 |
| 2007/0163994 A1 * | 7/2007 | Rauf | ................ | H01J 37/32357 216/62 |
| 2012/0028469 A1 * | 2/2012 | Onizawa | ............... | C23C 16/345 438/694 |

* cited by examiner

702 ADAD...
704 ABABAB/ADAD/ABABAB/ADAD
706 ABABAB/ACAC/ABABAB/ACAC
708 ABABAB/CDCD/ABABAB/CDCD
710 ABABAB/CDCD/ADAD/ABABAB/CDCD/ADAD

FIG. 7B

MIXED MODE PULSING ETCHING IN PLASMA PROCESSING SYSTEMS

CLAIM OF PRIORITY

This application is a continuation and claims priority under 35 USC § 120 to U.S. patent application Ser. No. 14/510,866, filed on Oct. 9, 2014, entitled "Mixed Mode Pulsing Etching In Plasma Processing Systems", which is a divisional of U.S. patent application Ser. No. 13/550,548 filed on Jul. 16, 2012, (now U.S. Pat. No. 8,883,028, issued on Nov. 11, 2014), entitled "Mixed Mode Pulsing Etching In Plasma Processing Systems," which claims priority under 35 USC. 119(e) to a commonly-owned U.S. Provisional Patent Application No. 61/581,054, filed on Dec. 28, 2011, entitled "Mixed Mode Pulsing Etching In Plasma Processing Systems," all of which are incorporated herein by reference.

BACKGROUND OF THE INVENTION

Plasma processing systems have long been employed to process substrates (e.g., wafers or flat panels or LCD panels) to form integrated circuits or other electronic products. Popular plasma processing systems may include capacitively coupled plasma processing systems (CCP) or inductively coupled plasma processing systems (ICP), among others.

Generally speaking, plasma substrate processing involves a balance of ions and radicals (also referred to as neutrals). As electronic devices become smaller and/or more complex, etching requirements such as selectivity, uniformity, high aspect ratio, aspect dependent etching, etc., have increased. While it has been possible to perform etches on the current generation of products by changing certain parameters such as pressure, RF bias, power, etc., the next generation of smaller and/or more sophisticated products demand different etch capabilities. The fact that ions and radicals cannot be more effectively decoupled and independently controlled in the current art has limited and in some cases made it impractical to perform some etch processes to manufacture these smaller and/or more sophisticated electronic devices in some plasma processing systems.

In the prior art, attempts have been made to obtain plasma conditions to modulate the ion-to-radical ratio at different times during an etch. In a conventional scheme, the source RF signal may be pulsed (e.g., on and off) in order to obtain a plasma that has the normal ion to neutral flux ratio during one phase of the pulse cycle (e.g., the pulse on phase) and a plasma with lower ion to neutral flux ratio during another phase of the pulse cycle (e.g., during the pulse off phase). It is known that source RF signal may be pulsed synchronously with bias RF signal.

However, it has been observed that while the prior art pulsing has, to some extent, resulted in alternate phases of normal ion to neutral flux ratio plasmas at different points in time and has opened up the operating window for some processes, larger operating windows are still desired.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 7A and 7B illustrate, in accordance with embodiments of the invention, different example variations of the gas pulsing scheme discussed in connection with FIG. 6.

DETAILED DESCRIPTION OF EMBODIMENTS

Figure 1:
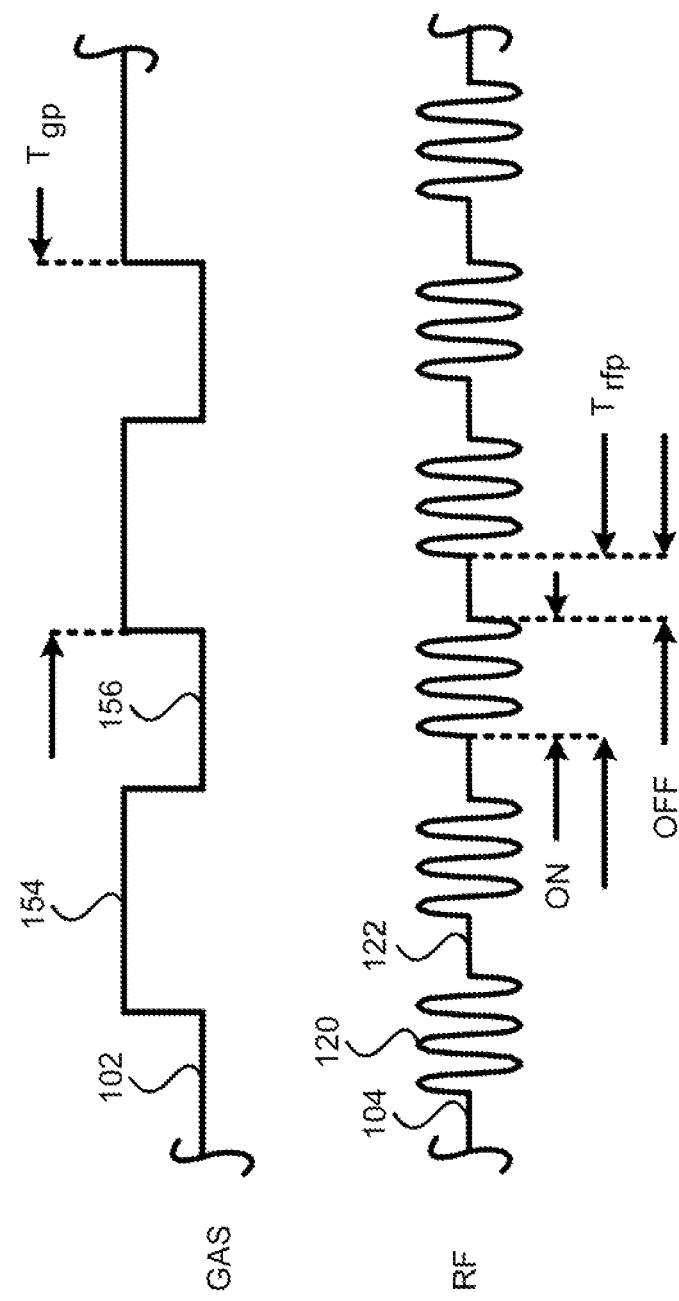
FIG. 1 shows, in accordance with one or more embodiments of the invention, an example combination pulsing scheme where the input gas (such as reactant gas and/or inert gas) and the source RF signal are both pulsed, albeit at different pulsing frequencies.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention related to a combination pulsing scheme that pulses the input gas (e.g., reactant gases and/or inert gases) using a first pulsing frequency and the source RF signal at a different second pulsing frequency. Although an inductively coupled plasma processing system and an inductive RF power source are employed to discuss in the examples herein, it should be understood that embodiments of the invention apply equally to capacitively coupled plasma processing systems and capacitive RF power sources.

In one or more embodiments, the input gas is pulsed at a slower pulsing frequency, and the inductive source RF signal is pulsed at a different, faster pulsing frequency in an inductively coupled plasma processing system. For example, if the inductive source RF signal is at 13.56 MHz, the inductive source RF signal may be pulsed at, for example, 100 Hz while the gas is pulsed at a different pulsing rate, such as 1 Hz.

Thus, a complete gas pulse cycle is 1 second in this example. If the gas pulsing duty cycle is 70%, the gas may be on for 70% of the 1-second gas pulsing period and off for 30% of the 1-second gas pulsing period. Since the source RF signal pulsing rate is 100 Hz, a complete RF signal pulsing period is 10 ms. If the RF pulsing duty cycle is 40%, the RF on-phase (when the 13.56 MHz signal is on) is 40% of the 10 ms RF pulsing period and the RF off phase (when the 13.56 MHz signal is off) is 60% of the 10 ms RF pulsing period.

In one or more embodiments, the inductive source RF signal may be pulsed with two different frequencies while the gas is pulsed at its own gas pulsing frequency. For example, the aforementioned 13.56 MHz RF signal may be pulsed not only at frequency f1 of 100 Hz but may also be pulsed with a different, higher frequency during the on-phase of frequency f1. For example, if the RF pulsing duty cycle is 40% of the f1 pulse, the on-phase of f1 is 40% of 10 ms or 4 ms. However, during that 4 ms on-phase of f1, the RF signal may also be pulsed at a different, higher frequency of f2 (such as at 400 Hz).

Embodiments of the invention contemplate that the gas pulses and RF pulses may be synchronous (i.e., with matching leading edge and/or lowering edge of the pulse signals) or may be asynchronous. The duty cycle may be constant or may vary in a manner that is independent of the other pulsing frequency or in a manner that is dependent on the other pulsing frequency.

In one or more embodiments, frequency chirping may be employed. For example, the RF signal may change its fundamental frequency in a periodic or non-periodic manner so that during a phase or a portion of a phase of any of the pulsing periods (e.g., any of the RF signal or gas pulsing periods), a different frequency (e.g., 60 MHz versus 13.56 MHz) may be employed. Likewise, the gas pulsing frequency may be changed with time in a periodic or non-periodic manner if desired.

In one or more embodiments, the aforementioned gas and source RF pulsing may be combined with one or more pulsing or variation of another parameter (such as pulsing of the bias RF signal, pulsing of the DC bias to the electrode, pulsing of the multiple RF frequencies at different pulsing frequencies, changing the phase of any of the parameters, etc.)

The features and advantages of embodiments of the invention may be better understood with reference to the figures and discussions that follow.

FIG. 1 shows, in accordance with an embodiment of the invention, an example combination pulsing scheme where the input gas (such as reactant gas and/or inert gas) and the source RF signal are both pulsed, albeit at different pulsing frequencies. In the example of FIG. 1, the input gas 102 is pulsed at a gas pulsing rate (defined as $1/T_{gp}$ where $T_{gp}$ is the period of the gas pulse) of about 2 seconds/pulse or 2 MHz.

The TCP source RF signal 104 of 13.56 MHz is pulsed at a RF pulsing rate (defined as $1/T_{rfp}$, where $T_{rfp}$ is the period of the RF pulsing). To clarify the concept of RF pulsing herein, the RF signal is on (such as the 13.56 MHz RF signal) during the time period 120 and the RF signal is off during the time period 122. Each of the gas pulsing rate and the RF pulsing rate may have its own duty cycle (defined as the pulse on-time divided by the total pulsing period). There are no requirements that the duty cycle has to be 50% for any of the pulse signals, and the duty cycle may vary as needed for a particular process.

In an embodiment, the gas pulsing and the RF signal pulsing are at the same duty cycle. In another embodiment, the gas pulsing and the RF signal pulsing are at independently controllable (and may be different) duty cycles to maximize granular control. In one or more embodiments, the leading and/or trailing edges of the gas pulsing signal and the RF pulsing signal may be synchronous. In one or more embodiments, the leading and/or trailing edges of the gas pulsing signal and the RF pulsing signal may be asynchronous.

Figure 2:
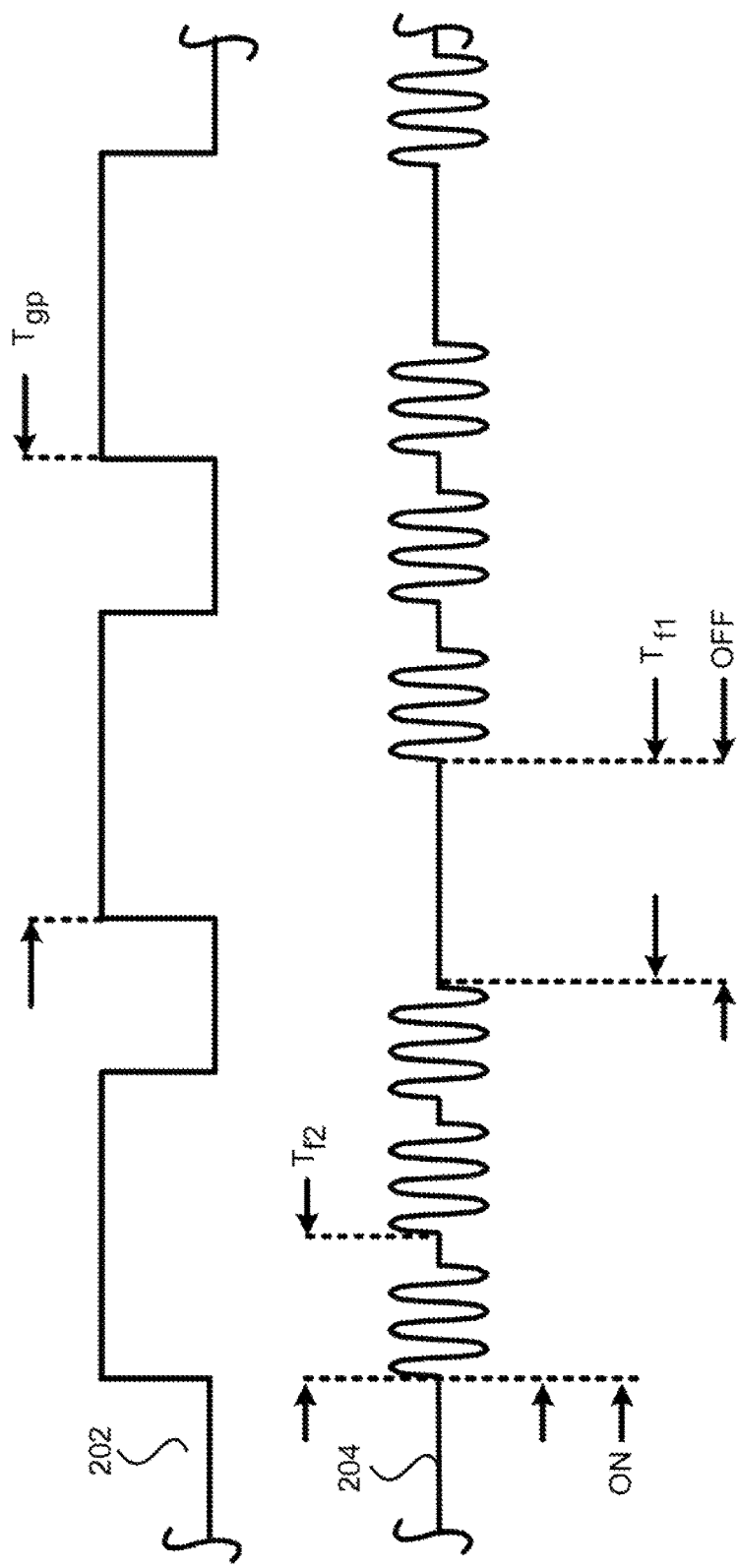
FIG. 2 shows, in accordance with one or more embodiments of the invention, another example combination pulsing scheme.

In FIG. 2, the gas input 202 is pulsed at its own gas pulsing frequency. However, the source RF signal 204 may be pulsed with two different frequencies while the gas is pulsed at its own gas pulsing frequency (defined as $1/T_{gp}$, where $T_{gp}$ is the period of the gas pulse). For example, the RF signal may be pulsed not only at frequency f1 (defined as $1/T_{f1}$ from the figure) but may also be pulsed with a different, higher frequency during the on-phase of f1 pulsing. For example, during this on-phase of f1 pulsing, the RF signal may be pulsed at a different pulsing frequency f2 (defined as $1/T_{f2}$ from the figure).

Figure 3:
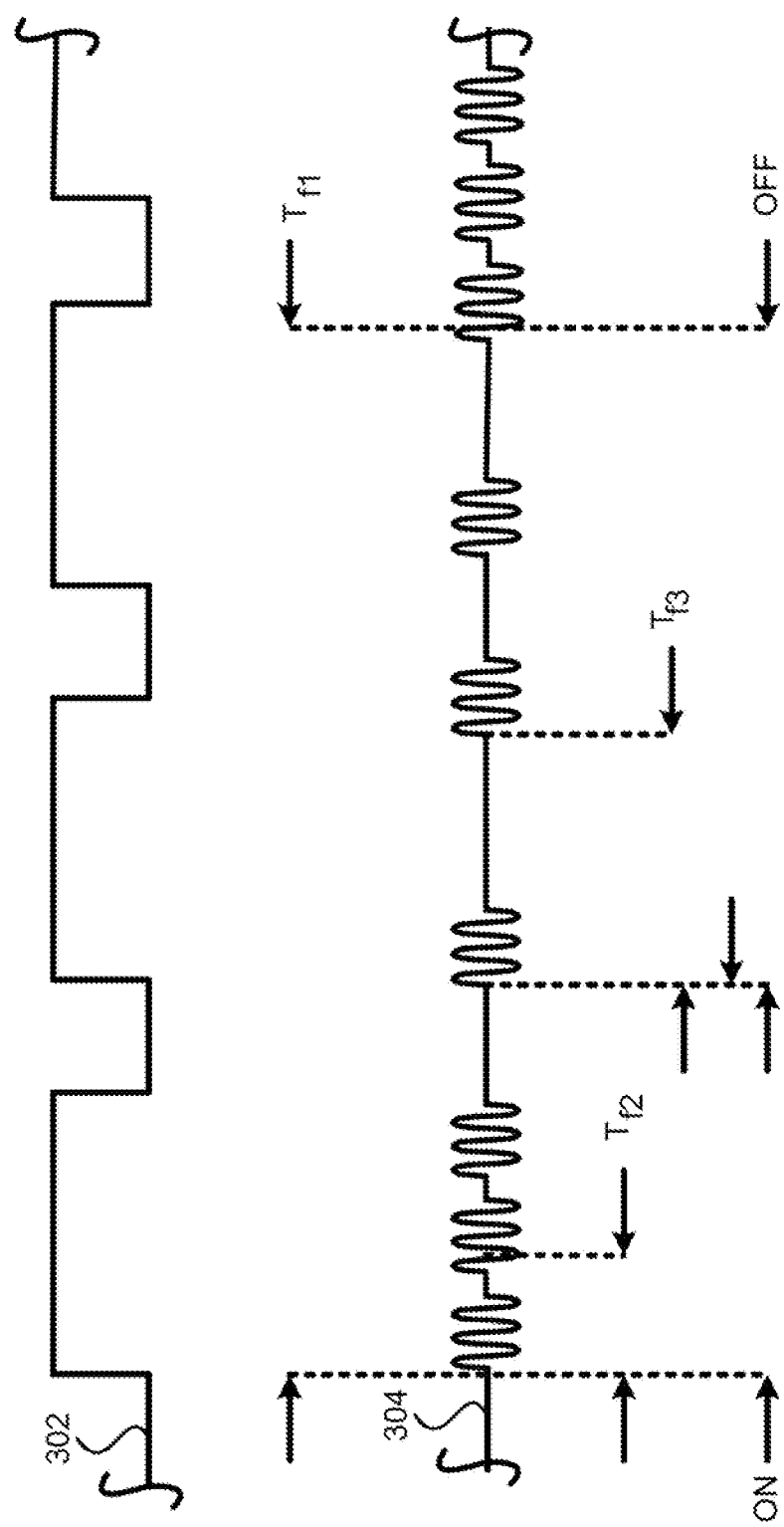
FIG. 3 shows, in accordance with one or more embodiments of the invention, yet another example combination pulsing scheme.

In FIG. 3, the gas input 302 is pulsed at its own gas pulsing frequency. However, the source RF signal 304 may be pulsed with three different frequencies while the gas is pulsed at its own gas pulsing frequency. For example, the RF signal may be pulsed not only at frequency f1 (defined as $1/T_{f1}$ from the figure) but may also be pulsed with a different, higher frequency during the on-phase of f1 pulsing. Thus, during this on-phase of f1 pulsing, the RF signal may be pulsed at a different pulsing frequency f2 (defined as $1/T_{f2}$ from the figure. During the off-phase of f1 pulsing, the RF signal may be pulsed at a different pulsing frequency f3 (defined as $1/T_{f3}$ from the figure).

Additionally or alternatively, although the duty cycle is shown to be constant in the examples of FIGS. 1-3, the duty cycle may also vary, in a periodic or non-periodic manner and independently or dependently on the phases of one of the pulsing signals (whether gas pulsing signal, RF pulsing signal, or otherwise). Further, the change in the duty cycle may be synchronous or asynchronous with respect to phase of any one of the pulsing signals (whether gas pulsing signal, RF pulsing signal, or otherwise).

In one embodiment, the duty cycle of the RF pulsing is advantageously set to be one value during the on-phase of the gas pulse (e.g., 154 in FIG. 1), and the duty cycle of the RF pulsing is set to be another different value during the off-phase of the gas pulse (e.g., 156 of FIG. 1). In a preferred embodiment, the duty cycle of the RF pulsing is advantageously set to be one value during the on-phase of the gas pulse (e.g., 154 in FIG. 1) and the duty cycle of the RF pulsing is set to be a lower value during the off-phase of the gas pulse (e.g., 156 of FIG. 1). It is contemplated that this RF pulsing duty cycle embodiment wherein the duty cycle is higher during the on phase of the gas pulsing and lower during the off phase of the gas pulsing is advantageous for some etches. It is contemplated that this RF pulsing duty cycle variance wherein the duty cycle is lower during the on phase of the gas pulsing and higher during the off phase of the gas pulsing is advantageous for some etches. As the term is employed herein, when a signal is pulsed, the duty cycle is other than 100% during the time when the signal is pulsed (i.e., pulsing and "always on" are two different concepts).

Additionally or alternatively, frequency chirping may be employed with any of the pulsing signals (whether gas pulsing signal, RF pulsing signal, or otherwise). Frequency chirping is described in greater detail in connection with the RF pulsing signal in FIG. 4 below.

In one or more embodiments, the gas is pulsed such that during the gas pulsing on phase, reactant gas(es) and inert gas(es) (such as Argon, Helium, Xenon, Krypton, Neon, etc.) are as specified by the recipe. During the gas pulsing off phase, at least some of both the reactant gas(es) and inert gas(es) may be removed. In other embodiments, at least some of the reactant gas(es) is removed and replaced by inert gas(es) during the gas pulsing off phase. In an advantageous, at least some of the reactant gas(es) is removed and replaced by inert gas(es) during the gas pulsing off phase to keep the chamber pressure substantially the same.

In one or more embodiments, during the gas pulsing off phase, the percentage of inert gas(es) to total gas(es) flowed into the chamber may vary from about X % to about 100%, wherein X is the percentage of inert gas(es) to total gas flow that is employed during the gas pulsing on phase. In a more preferred embodiment, the percentage of inert gas(es) to total gas(es) flowed into the chamber may vary from about 1.1 X to about 100%, wherein X is the percentage of inert gas(es) to total gas flow that is employed during the gas pulsing on phase. In a preferred embodiment, the percentage of inert gas(es) to total gas(es) flowed into the chamber may vary from about 1.5 X to about 100%, wherein X is the percentage of inert gas(es) to total gas flow that is employed during the gas pulsing on phase.

The gas pulsing rate is limited at the high end (upper frequency limit) by the residence time of the gas in the chamber. This residence time concept is one that is known to one skilled in the art and varies from chamber design to chamber design. For example, residence time typically ranges in the tens of milliseconds for a capacitively coupled chamber. In another example, residence time typically ranges in the tens of milliseconds to hundreds of milliseconds for an inductively coupled chamber.

In one or more embodiments, the gas pulsing period may range from 10 milliseconds to 50 seconds, more preferably from 50 milliseconds to about 10 seconds and preferably from about 500 milliseconds to about 5 seconds.

The source RF pulsing period is lower than the gas pulsing period in accordance with embodiments of the invention. The RF pulsing frequency is limited at the upper end by the frequency of the RF signal (e.g., 13.56 MHz would establish the upper limit for the RF pulsing frequency if the RF frequency is 13.56 MHz).

Figure 4:
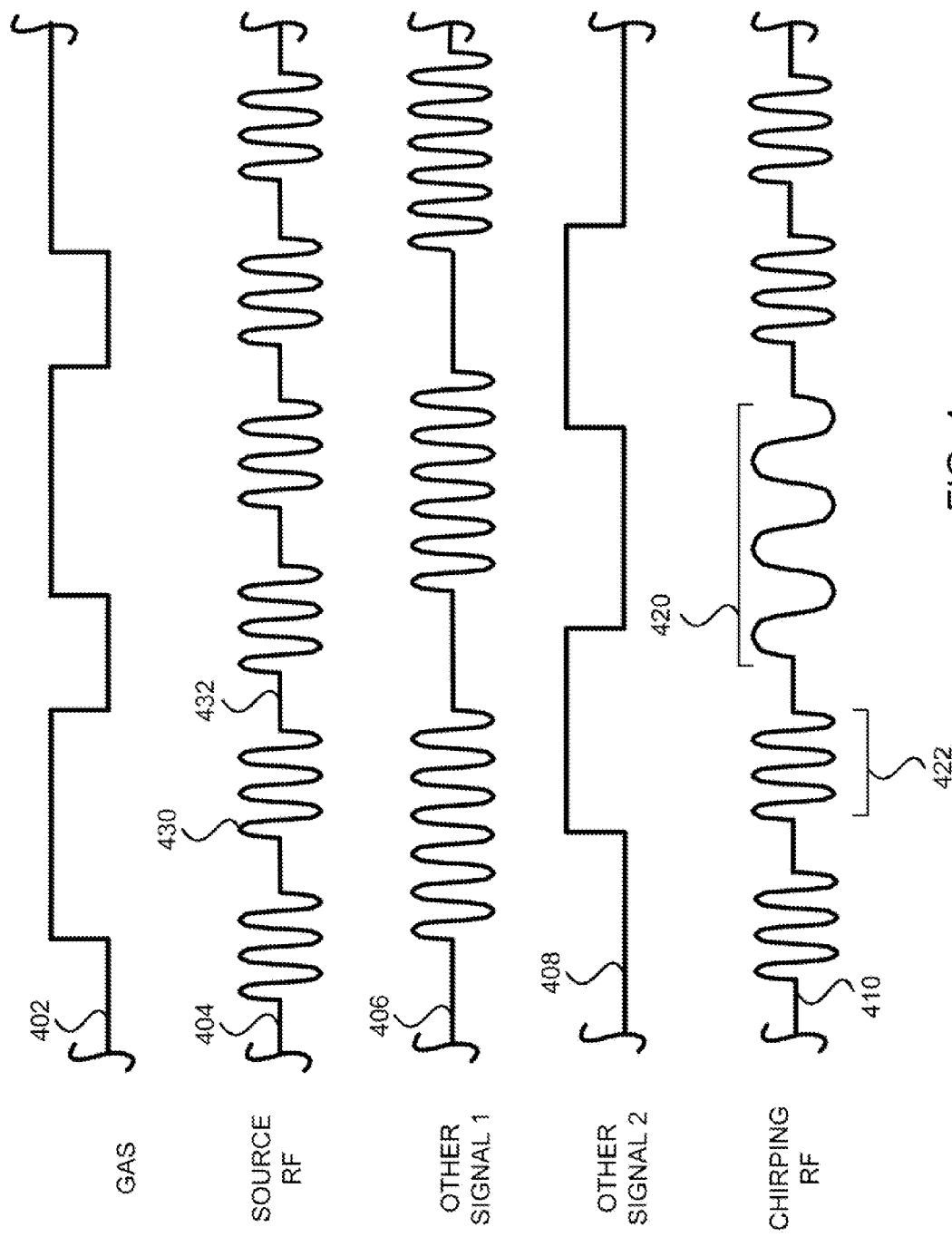
FIG. 4 shows, in accordance with one or more embodiments of the invention, other possible combinations for the combination pulsing scheme.

FIG. 4 shows, in accordance with one or more embodiments of the invention, other possible combinations. In FIG. 4, another signal 406 (such as bias RF or any other periodic parameter) may be pulsed along with gas pulsing signal 402 and source RF pulsing signal 404 (pulsed as shown with 430 and 432). The pulsing of signal 406 may be made synchronous or asynchronous with any other signals in the system.

Alternatively or additionally, another signal 408 (such as DC bias or temperature or pressure or any other non-periodic parameter) may be pulsed along with gas pulsing signal 402 and source RF pulsing signal 404. The pulsing of signal 408 may be made synchronous or asynchronous with any other signals in the system.

Alternatively or additionally, another signal 410 (such as RF source or RF bias or any other non-periodic parameter) may be chirped and pulsed along with gas pulsing signal 402. For example, while signal 410 is pulsing, the frequency of signal 410 may vary depending on the phase of signal 410 or another signal (such as the gas pulsing signal) or in response to a control signal from the tool control computer. In the example of FIG. 1, reference 422 points to a region of higher frequency than the frequency associated with reference number 420. An example of a lower frequency 422 may be 27 MHz and a higher frequency 420 may be 60 MHz. The pulsing and/or chirping of signal 410 may be made synchronous or asynchronous with any other signals in the system.

Figure 5:
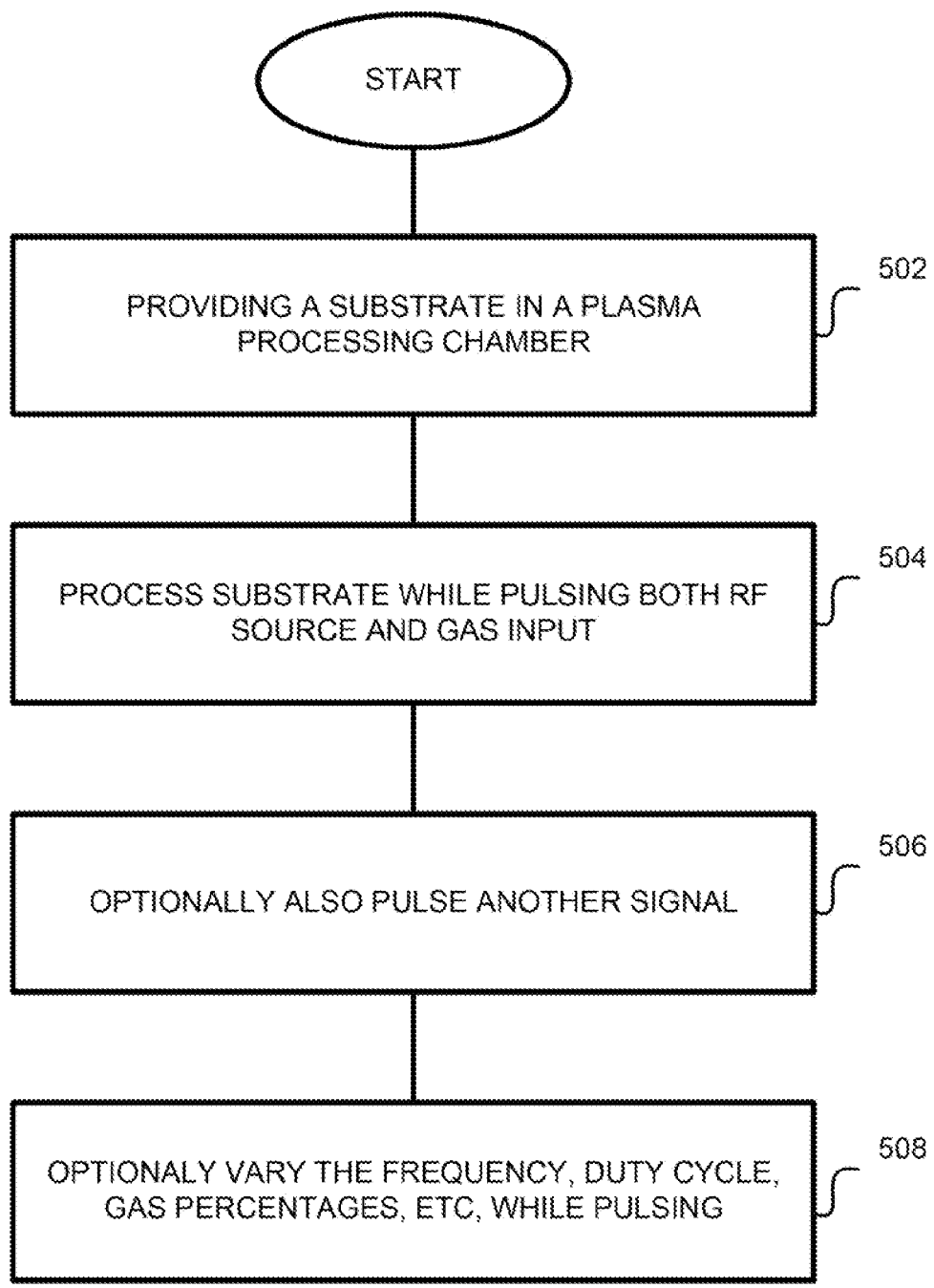
FIG. 5 shows, in accordance with one or more embodiments of the invention, the steps for performing combination pulsing.

FIG. 5 shows, in accordance with an embodiment of the invention, the steps for performing combination pulsing. The steps of FIG. 5 may be executed via software under control of one or more computers, for example. The software may be stored in a computer readable medium, including a non-transitory computer readable medium in one or more embodiments.

In step 502, a substrate is provided in a plasma processing chamber. In step 504, the substrate is processed while pulsing both the RF source and the input gas. Optional pulsing of one or more other signals (such as RF bias or another signal) is shown in step 506. In step 508, the frequency, duty cycle, gas percentages, etc. may optionally be varied while pulsing the RF source and the input gas.

In one or more embodiments, the gas is pulsed such that there are at least two phases per cycle, with cycles repeating periodically. The other parameters, including the RF source signal, may be left unpulsed. During the first phase, the reactant gas (which may comprise multiple different etching and/or polymer-forming gases) to inert gas (such as one or more of Argon, Helium, Xenon, Krypton, Neon, etc.) ratio is at a first ratio. During the second phase, the reactant gas to inert gas ratio is at a second ratio different from the first ratio. If the ratio of reactant gas flow to total gas flow into the chamber is reduced (i.e., the ratio of inert gas to total gas flow into the chamber is increased) during the second phase, the chamber contains a higher percentage of the inert gas during the second phase than in the first phase. In this case, an ion-dominant plasma results wherein the plasma ion flux is formed primarily with inert gas to perform the etching.

This is unlike the prior art situation where reactant gas is added to pulse the gas. By increasing the percentage of the inert gas in the chamber without increasing the reactant gas flow into the chamber, embodiments of the invention achieve an ion-rich plasma to improve etch uniformity, directionality and/or selectivity.

In an embodiment, the ratio is changed not by adding any reactant (such as etchant or polymer-forming) gases into the chamber but by reducing the reactant gases flow rate such that the flow percentage of inert gas to reactant gas increases. In this embodiment, the chamber pressure would inherently reduce during the second phase.

Alternatively or additionally, the ratio of reactant gas(es) to inert gas(es) may be changed by increasing the inert gas(es) flow into the chamber while keeping the reactant gas(es) flow into the chamber either constant or by reducing the reactant gas(es) flow (but not by increasing the reactant gases flow into the chamber). In an embodiment, the flow of inert gas is increased to offset the reduction in the flow of reactant gas. In this embodiment, the chamber pressure remains substantially the same during the first and second phases. In another embodiment, the flow of inert gas is increased but is insufficient to fully offset the reduction in the flow of reactant gas. In this embodiment, the chamber pressure is reduced during the second phase. In another embodiment, the flow of inert gas is increased more than sufficient to offset the reduction in the flow of reactant gas. In this embodiment, the chamber pressure is increased during the second phase.

As mentioned, in one or more embodiments, during the gas pulsing second phase, the percentage of inert gas(es) to total gas(es) flowed into the chamber may vary from about X % to about 100%, wherein X is the percentage of inert gas(es) to total gas flow that is present when the plasma chamber is stabilized for processing or the percentage of inert gas(es) to total gas flow that is present during the first phase. In a more preferred embodiment, the percentage of inert gas(es) to total gas(es) flowed into the chamber may vary from about 1.1 X to about 100%. In a preferred embodiment, the percentage of inert gas(es) to total gas(es) flowed into the chamber may vary from about 1.5 X to about 100% during the second phase.

The gas pulsing rate is limited at the high end (upper frequency limit) by the residence time of the gas in the chamber. As mentioned, for example, residence time typically ranges in the tens of milliseconds for a capacitively coupled chamber. In another example, residence time typically ranges in the tens of milliseconds to hundreds of milliseconds for an inductively coupled chamber. Also as mentioned, in one or more embodiments, the gas pulsing period may range from 10 milliseconds to 50 seconds, more preferably from 50 milliseconds to about 10 seconds and preferably from about 500 milliseconds to about 5 seconds.

In one or more embodiments, the inert gas added during the second phase of the periodic pulsing may be the same inert gas or a different inert gas with different chemical composition and/or different constituent gases. Alternatively or additionally, the duty cycle of the gas pulsing rate may vary from 1% to 99%. Alternatively or additionally, the gas pulsing rate may be chirped, i.e., may change, during processing. For example, the gas pulsing may be done with a 5-second gas pulsing period with a 40% duty cycle and then switched to a 9-second gas pulsing period with either the same 40% duty cycle or a different duty cycle. The chirping may be done periodically in accordance with a chirping frequency (such as 20 second chirping frequency wherein the gas pulsing frequency may be changed every 20 seconds).

Figure 6:
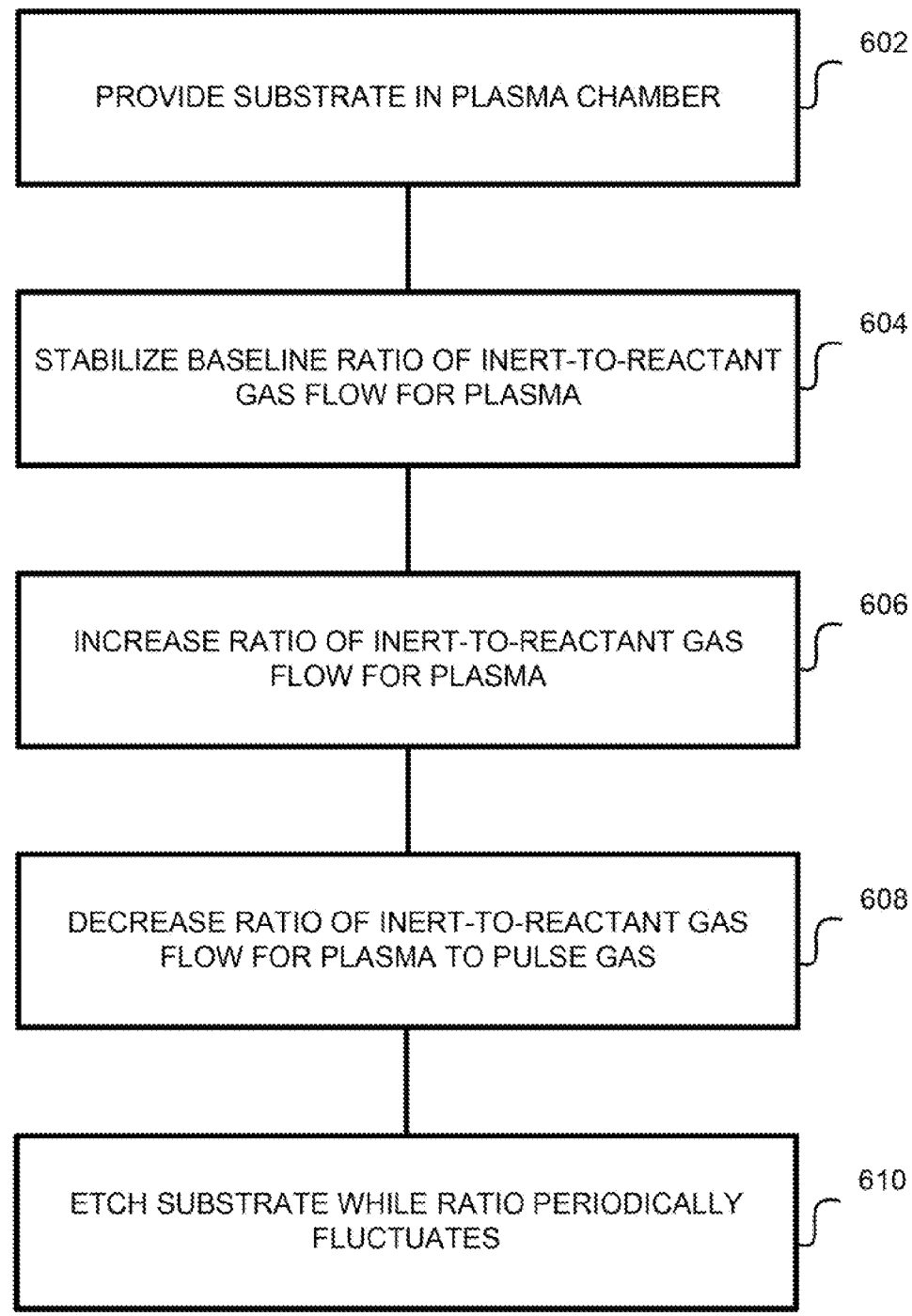
FIG. 6 shows, in accordance with one or more embodiments of the invention, the steps for performing gas pulsing.

FIG. 6 shows, in accordance with one or more embodiments of the invention, the steps for performing gas pulsing. The steps of FIG. 6 may be executed via software under control of one or more computers, for example. The software may be stored in a computer readable medium, including a non-transitory computer readable medium in one or more embodiments.

In step 602, a substrate is provided in a plasma processing chamber. In step 604, a plasma is generated in the chamber and stabilized with a baseline ratio of inert gas flow to reactant gas flow. In step 606, the ratio of inert gas flow to reactant gas flow is increased in one phase of the gas pulsing without increasing the reactant gas flow into the chamber. In step 608, the ratio of inert gas flow to reactant gas flow is decreased, relative to the ratio of inert gas flow to reactant gas flow of step 606, in another phase of the gas pulsing without increasing the reactant gas flow into the chamber. In various embodiments, the ratio of inert gas flow to reactant gas flow in step 608 may be the substantially the same as the ratio of inert gas flow to reactant gas flow of step 604 (stabilize plasma step) or may be higher or lower than the ratio of inert gas flow to reactant gas flow of stabilize step 604. In step 610, the substrate is processed while the gas is pulsed by having the aforementioned inert-to-reactant flow ratio fluctuates periodically with the ratios of steps 606 and 608.

Figure 7A:
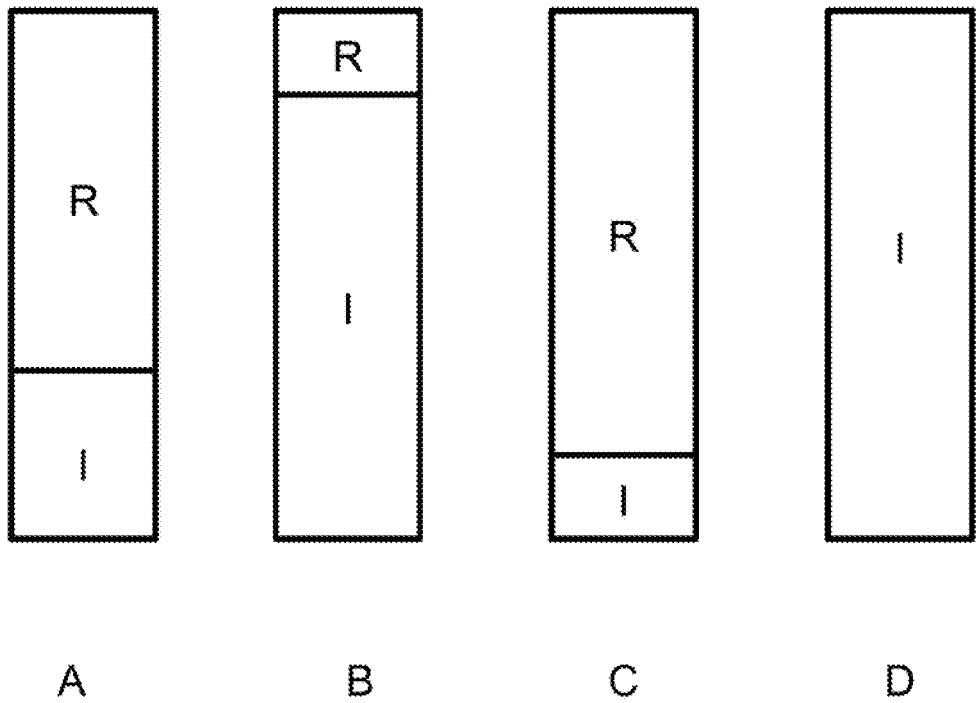

FIGS. 7A and 7B illustrate, in accordance with embodiments of the invention, different example variations of the gas pulsing scheme discussed in connection with FIG. 6. In the example of FIG. 7A, cases A, C, D, and E represents the various ratio of inert gas to reactant gas. In case A, the ratio of inert gas (I) to reactant gas (R) is 3:7, for example. In case B, the ratio of inert gas to reactant gas is 8:1, for example. In case C, the ratio of inert gas to reactant gas is 1:9, for example. In case D, the gas flow into the chamber is essentially all inert. While example ratio values are given, the exact values of the ratios are only illustrative; the important point is that these cases all have different ratios relative to one another.

In FIG. 7B, an example pulsing 702 may be ADAD in a preferred embodiment where the gas pulse may fluctuate periodically between case A and case D of FIG. 7A and repeat.

Another example pulsing 704 may be ABABAB/ADAD/ABABAB/ADAD where the gas pulse may fluctuate periodically between case A and case B of FIG. 7A, then between cases A and D of FIG. 7A, and then back to cases A and B of FIG. 7A and repeat.

Another example pulsing 706 may be ABABAB/ACAC/ABABAB/ACAC where the gas pulse may fluctuate periodically between case A and case B of FIG. 7A, then between cases A and D of FIG. 7A, and then back to cases A and B of FIG. 7A and repeat.

Another example pulsing 708 may be ABABAB/CDCD/ABABAB/CDCD where the gas pulse may fluctuate periodically between case A and case B of FIG. 7A, then between cases C and D of FIG. 7A, and then back to cases A and B of FIG. 7A and repeat.

Another example pulsing 710 may be ABABAB/CDCD/ADAD/ABABAB/CDCD/ADAD where the gas pulse may fluctuate periodically between case A and case B of FIG. 7A, then between cases C and D of FIG. 7A, then between cases A and D of FIG. 7A and then back to cases A and B of FIG. 7A and repeat.

Other examples may include 4 phases such as ABAB/CDCD/ADAD/ACAC and repeat. The complex pulsing is highly advantageous for processes involving, for example, in situ etch-then-clean or multi-step etches, etc.

In another embodiment, the gas pulsing of FIGS. 6, 7A and 7B may be combined with asynchronous or synchronous pulsing of the RF bias signal that is supplied to the powered electrode. In an example, when the gas is pulsed to a high inert gas percentage or 100% or near 100% inert gas percentage in one phase of the gas pulsing cycle, the RF bias signal is pulsed high. When the gas is pulsed to a lower inert gas percentage in another phase of the gas pulsing cycle, the RF bias signal is pulsed low or zero. In various embodiments, the pulsing frequency of the RF bias signal may be the same or different compared to the pulsing frequency of the gas pulsing. In various embodiments, the duty cycle of the RF bias signal may be the same or different compared to the duty cycle of the gas pulsing. Chirping may be employed with one or both of the RF bias signal pulsing and the gas pulsing if desired.

In each of the gas pulsing examples, the pulsing frequency, the number of pulses, the duty cycle, etc., may be varied kept constant throughout the etch or may vary periodically or non-periodically as required.

As can be appreciated from the foregoing, embodiments of the invention provide another control knob that can widen the process window for etch processes. Since many current plasma chambers are already provided with pulsing valves or pulsing mass flow controllers, the implementation of gas-pulsing in accordance with FIGS. 6-7A/7B and the discussion herein may be achieved without requiring expensive hardware retrofitting. Further, if RF pulsing is desired in conjunction with gas pulsing, many current plasma chambers are already provided with pulse-capable RF power supplies. Accordingly, the achievement of a wider process window via gas/RF power pulsing may be obtained without requiring expensive hardware retrofitting. Current tool owners may leverage on existing etch processing systems to achieve improved etches with minor software upgrade and/or minor hardware changes. Further, by having improved and/or more granular control of the ion-to-radical flux ratios, selectivity and uniformity and reverse RIE lag effects may be improved. For example, by increasing the ion flux relative to radical flux may improve the selectivity of one layer to another layer on the substrate in some cases. With such improved control of ion-to-radical, atomic layer etch (ALE) may be more efficiently achieved.

In one or more embodiments, mixed mode pulsing (MMP) etching is disclosed whereby the etching involves repeating a multi-step sequence, each sequence involving at least an MMP preparation (MMPP) phase and an MMP reactive (MMPR) phase. The mixed mode pulsing is configured to more fully separate ions and neutral radicals temporally (i.e., in time) in situ in a production inductively coupled plasma (ICP, also known as TCP or transformer coupled plasma in some instances) chamber or in a capacitively coupled plasma (CCP) chamber.

To clarify, the MMP etching is practiced in a production inductively coupled plasma (ICP) chamber to accomplish, for example, atomic layer etching (ALE) or very precise etching of the type that typically requires the use of another chamber (such as a beam-type chamber) in the prior art. The fact that the inventive MMP etching allows such atomic layer etching (ALE) or precise layer-by-layer etching in the production ICP chamber substantially improves the overall throughput since there is no need to transfer the substrate from the production chamber into another chamber for such ALE or precise layer-by-layer etching. The inventive MMP etching also eliminates the need for specialized ALE or layer-by-layer etching equipment, thereby reducing manufacturing cost. MMP etching is also employed in a production ICP chamber to accomplish high selectivity etching, as will be discussed later herein.

To clarify, an ICP chamber, which construction is well known, involves the use of at least one RF-powered inductive coil for inductively coupling, through a dielectric window, RF energy to a plasma cloud formed from reactant and other gases. The plasma cloud is disposed below the dielectric window but above a substrate for etching the substrate. The substrate itself is disposed on a work piece holder, typically an ESC chuck for example. The work piece holder may also be supplied with its own RF signal(s), if desired. RF energy provided to the work piece holder is known as bias power. ICP chambers are commonly employed for producing substrates in today's IC (integrated circuit) fabrication facilities and are suitable for high throughput.

In one or more embodiments, the MMP preparation phase involves using plasma to generate radicals (also known as neutrals) from reactant gases. No bias power is applied to the substrate work piece holder in one embodiment. The elimination or minimal usage of bias power is critical for reducing the influence of ions during the MMP preparation phase.

Using silicon etching as an example, the reactant gas may be chlorine ($Cl_2$), for example. Depending on the material to be etched, other reactant gases may be for example $C_xF_y$ or $CH_xF_y$ (where x and y are integers), $CH_3Cl$, $N_2$, $BCL_3$, $O_2$, or other commonly used reactant gases for etching substrates. During the MMP preparation phase, a plasma is formed from the reactant gas and allowed to adsorb into exposed top layer of the silicon substrate. The MMP preparation phase is timed to allow the adsorption to penetrate at least one atomic layer of silicon in one embodiment and multiple atomic layers of silicon in another embodiment if a more aggressive etch is desired.

Parameters of the chambers are optimized to increase the speed of adsorption without unduly removing the adsorbed SiCl layer in the MMP preparation phase. For example, the inductive coil RF frequency may be different during the MMP preparation phase relative to the MMP reactive phase to promote adsorption in one or more embodiments. Alternatively or additionally, as another example, the substrate or the substrate surface may be heated (or cooled) during the MMP preparation phase. Alternatively or additionally, as another example, the inductive coil RF power may be pulsed on and off (either symmetrically or non-symmetrically with respect to the duration of the on and off cycles) to reduce ion energy and/or to promote adsorption. In one or more embodiments, inductive coil RF signal(s) may be chirped with different RF frequencies during a single MMP preparation phase.

Alternatively or additionally, as another example, the chamber gap between the electrodes (of a variable gap chamber) may be set larger during the MMP preparation phase relative to the MMP reactive phase in order to lower the ion energy level, reduce self-bias, and/or reduce the influence of ions. Alternatively or additionally, as another example, if ions are incidentally generated, the parameters may be adjusted so that the ion energy is below the level required to etch the adsorbed SiCl layer in one or more embodiments. For example, chamber pressure may be kept high (e.g., above 40 mT in one example etch) during the MMP preparation phase to reduce the ion energy in one or more embodiments.

In one or more embodiments, some non-reactive gas (such as argon) may be allowed during the MMP preparation phase. However, such non-reactive gas flow during the MMP preparation phase, if allowed, is set to be lower than the amount of non-reactive gas flow that occurs during the MMP reactive phase. The same non-reactive gas may be employed in both the MMP preparation phase and the MMP reactive phase or different non-reactive gases may be employed. In other embodiments, the MMP preparation phase involves only reactive gases (such as chlorine) and no non-reactive gases (such as argon) is employed during the MMP preparation phase.

In one or more embodiments, different reactive gases may be employed simultaneously during a single MMP preparation phase. Alternatively, in one or more embodiments, different reactive gases may be flowed in sequential order into the chamber during the MMP preparation phase. This may be advantageous for etching binary or other compounds. If desired, the chamber may be flushed with a non-reactive gas (such as argon) in between the flowing of different reactive gases during the MMP preparation phase.

For ALE etches where a single atomic layer etching is desired or where etching of a small number of atomic layers is desired, it is preferable that no bias power is applied during the MMP preparation phase. In applications where a higher throughput is desired while maintaining precision, a small amount of bias power (relative to the bias power applied during the MMP reactive phase) may be applied during the MMP preparation phase to promote some implantation of the reactive species. If the small amount of bias power is applied during the MMP preparation phase, this bias power may be kept constant during the MMP preparation phase or may be pulsed (either asynchronously or synchronously with the inductive coil RF pulsing) if desired.

After the MMP preparation phase, there is an MMP reactive phase during which reactant gases are not permitted to be present in the chamber and a plasma is generated from non-reactive gases (such as inert gases) to form a plasma having a specific ion energy window. In the above-mentioned silicon example, argon may be employed as the non-reactive gas during the MMP reactive phase. Alternatively or additionally, the non-reactive gas(es) may be Xe, He, Ne or clusters of any of the above.

In the MMP reactive phase, the ion energy of the Ar+ ions (which is generated from non-reactive gases in the absence of reactant gases) is above the threshold required to etch the adsorbed SiCl layer but desired to be below the threshold required to etch the non-adsorbed Si substrate below. For example, the ion energy window may be between 50 eV and 70 eV for etching silicon in one embodiment. This is one aspect of the self-limiting feature of one embodiment of the MMP etching that permits precise control of the etching and causes the etching to stop when the adsorbed layer is all etched away. Another aspect of the self-limiting feature of one embodiment of the MMP etching is control of the depth of the adsorbed SiCl layer during the MMP preparation phase, in one or more embodiments. Another aspect of the self-limiting feature of one embodiment of the MMP etching is the length of time of the MMP reactive phase to ensure that only some or all of the adsorbed SiCl layer is removed and the underlying Si material is not etched. Another aspect of the self-limiting feature of one embodiment of the MMP etching is the length of time of the MMP preparation phase.

Of significant note is the fact that the bias power is turned on during the MMP reactive phase (in contrast, the bias power is preferably completely off during the MMP preparation phase or is turned on to a level lower than the bias power level in the MMP reactive phase to help ensure that the ion energy remains below the threshold for ion-induced etching of the adsorbed layer). Other parameters of the chamber may be optimized to promote the directional etching of the adsorbed SiCl layer by the plasma that is formed from the non-reactive gas. For example, the chamber pressure may be reduced in the MMP reactive phase (relative to the higher chamber pressure of the MMP preparation phase) in order to reduce the number of collisions, thereby reducing the angle distribution of the ions and resulting in a more directional etch. As another example, the bias power may be pulsed on and off multiple times during a single MMP reactive phase. Alternatively or additionally, as another example, the RF inductive coil power may be pulsed on and off multiple times during a single MMP reactive phase.

Alternatively or additionally, as another example, both the bias power and the RF inductive coil power may be pulsed multiple times, either synchronously or asynchronously relative to one another, during a single MMP reactive phase. Alternatively or additionally, as another example, the inductive coil RF frequency may be different (such as higher to increase the ion energy distribution function) during the MMP reactive phase relative to the MMP preparation phase. In an example, the MMP reactive phase may employ 60 MHz for inductive coil RF signal while the MMP preparation phase may employ 13.56 MHz for the inductive coil RF signal during the MMP reactive phase. Alternatively or additionally, as another example, the bias RF and/or the inductive coil RF may be chirped with different RF frequencies during a single MMP reactive phase. Alternatively or additionally, a tailored bias waveform may be employed during the MMP reactive phase to reduce the ion energy. To elaborate, a tailored bias waveform is an RF bias signal having a waveform tailored or shaped (e.g., clipped or modified) in order to optimize or regulate the ion energy).

The MMP preparation phase and the following MMP reactive phase form a cycle, which cycle may be repeated a number of times until etching is deemed completed. To ensure complete or substantially complete removal of the reactant gas from the chamber prior to the MMP reactive phase, an MMP transition phase may (but not required in all cases) be interposed in between the MMP preparation phase and the MMP reactive phase to, for example, facilitate more complete removal of the reactant gas(es) and/or to stabilize and/or prepare the chamber for the MMP reactive phase. Alternatively or additionally, another transition phase may be employed in between the MMP transition phase of a preceding cycle and an MMP preparation phase to stabilize and/or prepare the chamber for the MMP preparation phase, in one or more embodiments.

Because of the need to perform the MMP reactive phase without using reactant gases (or as little reactant gas as possible compared to the MMP preparation phase), a limit is imposed on how fast the etch can be pulsed between the MMP preparation phase and the MMP transition phase. Since it takes some finite amount of time to evacuate a gas from a chamber, the transition between the MMP preparation phase and the MMP reactive phase is limited, in one embodiment, by the gas residence time of the chamber, which can be readily calculated by one skilled in the art. As mentioned, an MMP transition phase may be employed (but not required in all cases) in between the MMP preparation phase and the MMP reactive phase to help prepare the chamber for the MMP reactive phase (such as to ensure that all reactive gases are removed or to stabilize the chamber in one embodiment).

In one or more embodiments, the MMP preparation phase may be between about 0.01 second to about 5 seconds, more preferably from 0.2 second to about 1 second. In one or more embodiments, the MMP reactive phase may be between about 0.01 second to about 5 seconds, more preferably from 0.05 second to about 1 second. In one or more embodiments, the switching rate may be around 1 Hz. This is a differentiation from techniques that involve synchronous or asynchronous pulsing of the TCP and/or TCP/bias power that does not take gas residence time into consideration and/or does not involve the removal of reactant gases from the chamber during the MMP reactive phase.

Note that the use of a grid or some other structures to accelerate the ions toward the substrate is not necessary, in one or more embodiments. Also note that the MMP preparation and etching phases are advantageously performed completely in situ in the same ICP chamber that is employed for other substrate processing steps.

In one or more embodiments, the MMP reactive phase may be timed or may be terminated responsive to chamber monitoring (using for example optical emission spectroscopy techniques). In one or more embodiments, the reactive etching during the MMP reactive phase is allowed to etch only a single atomic layer (ALE). In this example, the adsorption may be controlled such that the adsorbed layer is around one atomic layer thick. In one or more embodiments, the reactive etching during the MMP reactive phase is allowed to proceed to etch thorough multiple atomic layers of the adsorbed substrate surface. In one or more embodiments, parameters of the chamber may be adjusted such that there is a bulk MMP reactive etch, followed by a more precise but slower monolayer MMP reactive etch during a single MMP reactive phase.

In one or more embodiments, MMP etching is employed to improve selectivity. Up to now, the MMP etching example involves a single material (such as silicon in the example). As mentioned above, the selection of the reactant gas during the MMP preparation phase involves selecting a suitable reactant gas for etching silicon (such as $Cl_2$), and the configuring of the ion energy level during the MMP reactive phase involves selecting an ion energy level suitable for etching the adsorbed SiCl layer but not the bulk non-adsorbed Si material below.

To improve selectivity between two materials when etching a substrate, the reactant gas may be chosen (for use during the MMP preparation phase) such that the reactant gas forms a plasma that favors adsorption into one material over the other material. Additionally or alternatively, the gas chosen may be adsorbed onto both materials but favors the formation of volatile compounds on one material over the other material. Additionally or alternatively, the gas chosen may cause deposition more on one material than on another material. Additionally or alternatively, the gas chosen may decrease the bonding strength at the surface of one material to a greater extent than the decrease in bonding strength at the surface of another material. Additionally or alternatively, the ion energy during the MMP reactive phase may be chosen to more aggressively etch one material over another material. An example of this MMP selectivity etching is etching polysilicon but not oxide. In this case, the reactant gas may be chosen to be $Cl_2$ during the MMP preparation phase, which does not tend to etch oxide based on chemistry considerations alone, and the ion energy threshold during the MMP reactive phase may be 70 eV for polysilicon and 80 eV for oxide, for example.

Figure 8:
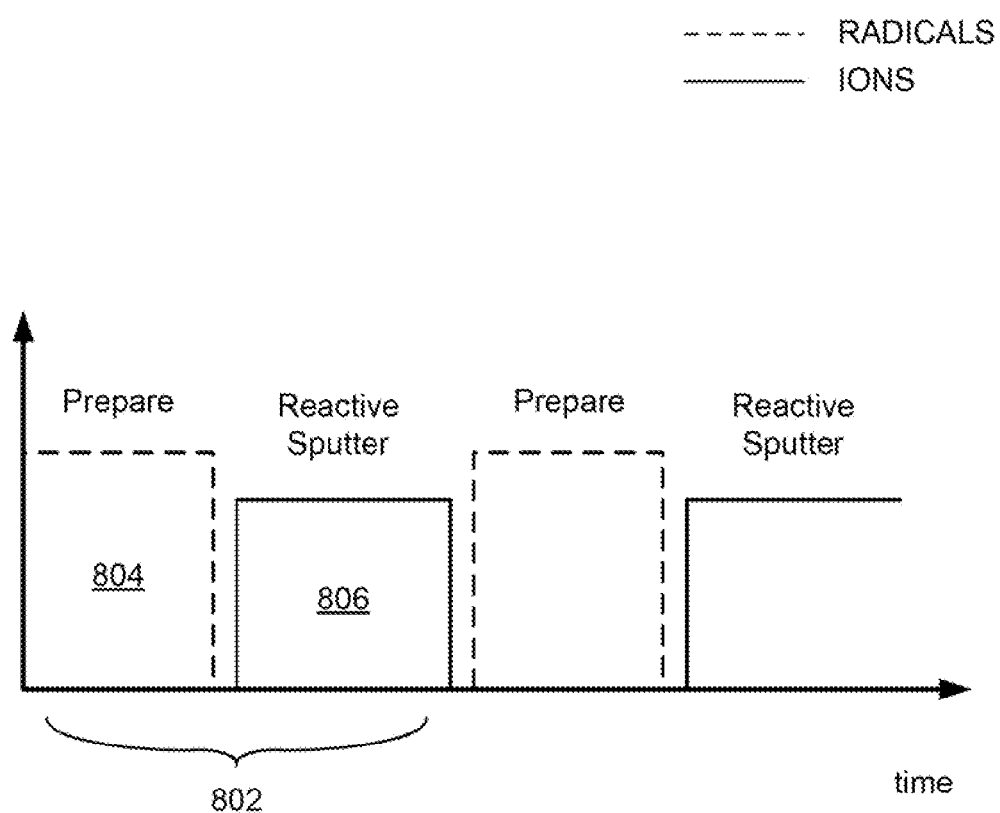
FIG. 8 shows, in accordance with an embodiment of the invention, conceptual MMP etching cycles for the silicon etching example, with each cycle involving at least an MMP preparation phase and an MMP reactive phase.

FIG. 8 shows, in accordance with an embodiment of the invention, conceptual MMP etching cycles (showing species density versus time) for the silicon etching example, with each cycle involving at least an MMP preparation phase and an MMP reactive phase. With reference to FIG. 8, an MMP etching cycle 802 involves at least an MMP preparation phase 804 and an MMP reactive phase 806. Chamber and gas conditions for each of MMP preparation phase 804 and MMP reactive phase 806 are discussed above. Of significant note is the fact that radicals and ions are separated in time, with a high amount of radicals and substantially no ions during the MMP preparation phase 804 and high amount of ions and substantially no radicals during the MMP reactive phase 806.

Figure 9:
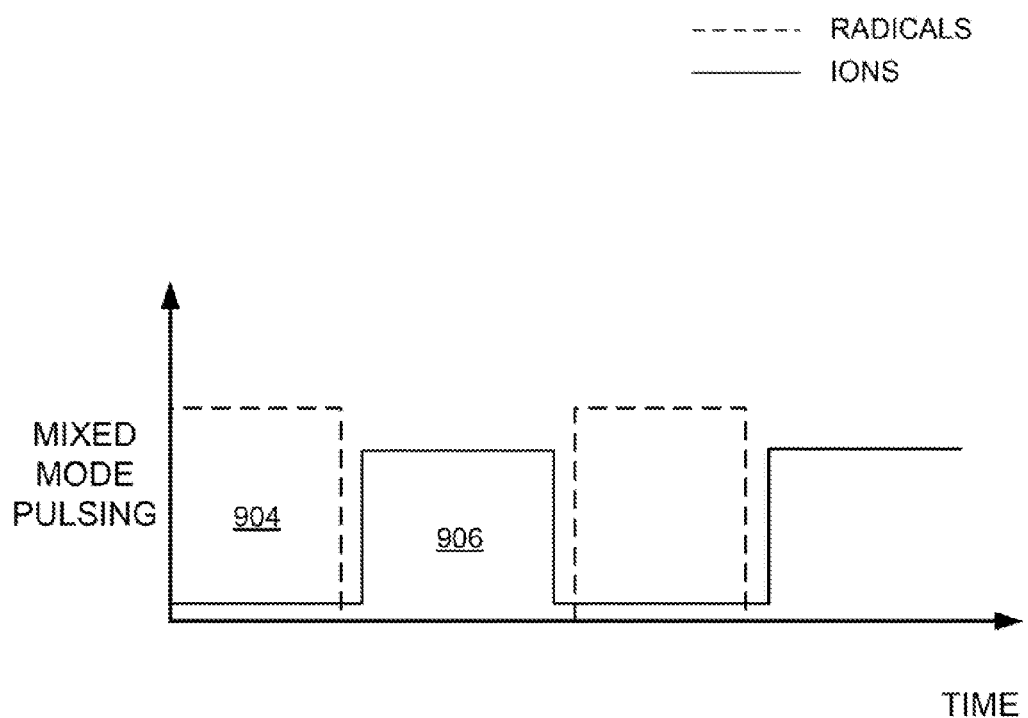
FIG. 9 shows, in accordance with an embodiment of the invention, other conceptual MMP etching cycles where some ions exist in the MMP preparation phase.

FIG. 9 shows, in accordance with an embodiment of the invention, other conceptual MMP etching cycles where some ions exist in the MMP preparation phase 904. Ions may be present as an unintended side-effect of plasma generation but is kept below (by manipulating chamber parameters) the threshold ion energy level necessary to etch the adsorbed SiCl surface during the MMP preparation phase 904. Ions may also be intentionally introduced by employing some small amount of bias power to promote implantation as discussed earlier. Nevertheless, the ion energy is kept below the threshold ion energy level necessary to etch the adsorbed surface during the MMP preparation phase.

During the MMP reactive phase 906, reactant gas is excluded from the chamber and preferably substantially no reactants are present in the chamber during the MMP reactive phase 906. Chamber and gas conditions for each of MMP preparation phase 904 and MMP reactive phase 906 are discussed above. As mentioned earlier, an MMP transition phase may be interposed between MMP preparation phase 904 and MMP reactive phase 906 if desired. Alternatively or additionally, another MMP transition phase may be interposed between preceding MMP reactive phase 906 and the MMP preparation phase 908 of the next MMP cycle.

Figure 10:
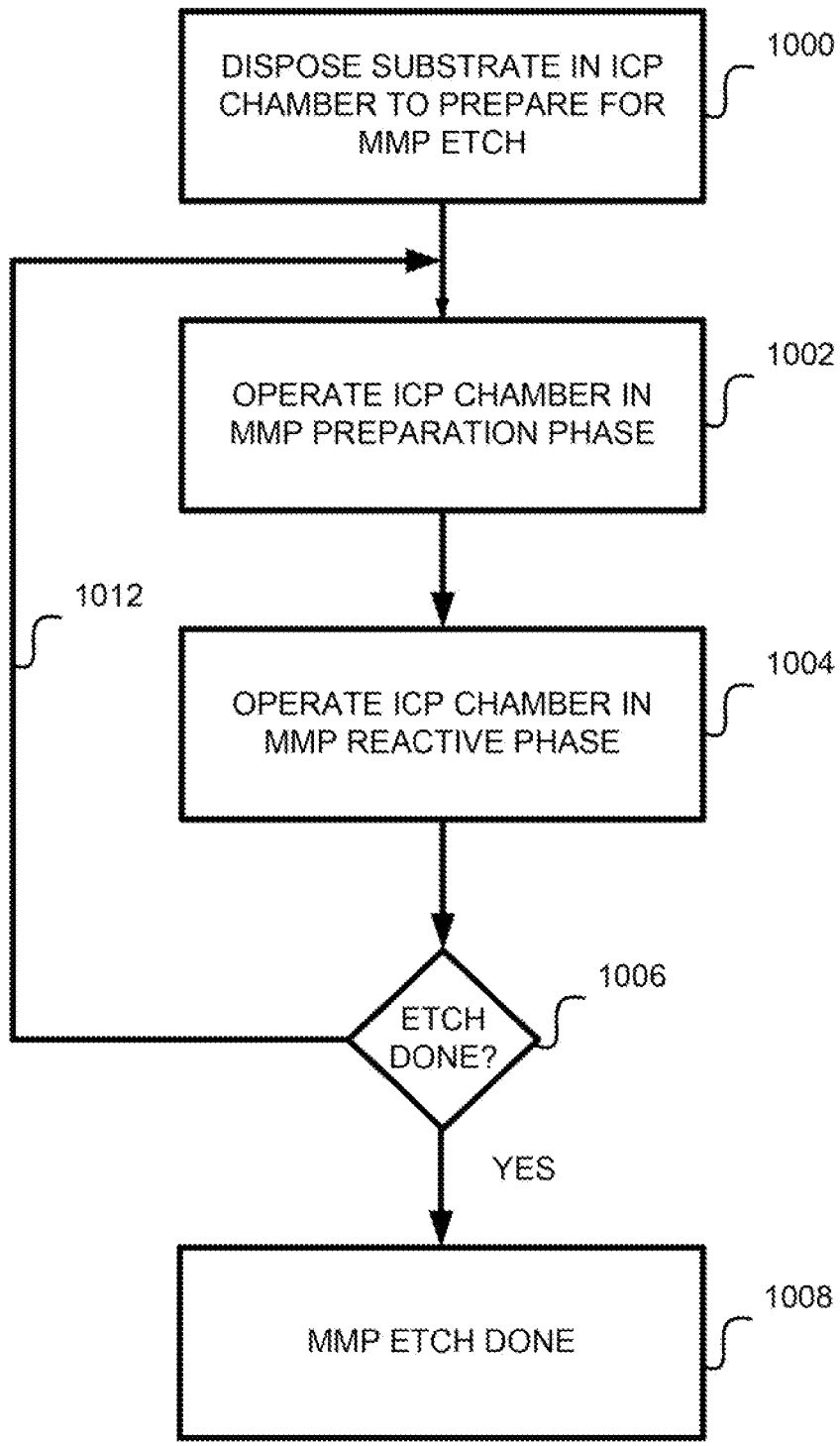
FIG. 10 shows, in accordance with an embodiment of the invention, a method for performing MMP etching in a production ICP chamber.

FIG. 10 shows, in accordance with an embodiment of the invention, a method for performing MMP etching in a production ICP chamber. In step 1000, a substrate is provided in the production ICP chamber to prepare for the in situ MMP etch. It should be understood that the substrate may have been disposed in the chamber for some time and other processing steps (such as bulk etch) may have already taken place prior to the MMP etching. In step 1002, the chamber is configured to operate in the MMP preparation phase. In this MMP preparation phase, reactant gas is allowed to adsorbed into the substrate surface with the assistance of plasma. The depth of adsorption is controlled to form one aspect of the self-limiting etch (to be performed during a subsequent MMP reactive phase). Other alternative or additional chamber conditions for the MMP preparation phase are discussed above.

In step 1004, the chamber is configured to etch the substrate in the MMP reactive phase. In this MMP reactive phase, reactant gas is excluded from the chamber and the bias power is increased (or turned on) to promote plasma-assisted removal of the adsorbed layer(s) using a plasma formed from inert gas(es). The ion energy during the MMP reactive phase is set to be higher than the level necessary to etch the adsorbed layer but lower than the level necessary to etch the non-adsorbed layer underneath, thereby essentially self-limit the etch. Other alternative or additional chamber conditions for the MMP reactive phase is discussed above. The MMP cycle including at least the MMP preparation phase and the MMP reactive phase is repeated (1012) until the MMP etch is deemed (1006) completed (1008).

As can be appreciated from the foregoing, embodiments of the MMP etch are highly suitable for ALE etch or precise etches (such as etches for fabrication 3-D logic or memory devices or MRAM) or high selectivity etches. Furthermore, embodiments of the invention reduce substrate damage and result in a flat etch front. The self-limiting nature and/or high selectivity of the MMP etch helps reduce structural damage to layer(s) or structure(s) that should not be etched. In some cases, the self-limiting nature of the MMP etch helps improve etch precision and/or etch profile and/or may reduce the need for overetching.

While this invention has been described in terms of several preferred embodiments, there are alterations, permutations, and equivalents, which fall within the scope of this invention. For example, although the MMP etch has been disclosed using an ICP chamber example, MMP etching may be performed in a capacitively coupled plasma (CCP) chamber if desired. With respect to the MMP etch, when the etch is performed in a capacitively coupled plasma chamber, the supplied higher RF frequency may be considered the source RF and the supplied lower RF frequency may be considered the bias RF irrespective whether these RF signals are provided to only one plate of the chamber or split up among the plates of the chamber.

As another example, the pulsing techniques discussed in the figures may be combined in any combination to suit the requirement of a particular process. For example, the duty cycle variance may be practiced with techniques discussed with any one (or part of any one or a combination of multiple ones) of the figures. Likewise, the frequency chirping may be practiced with techniques discussed with any one (or part of any one or a combination of multiple ones) of the figures and/or with duty cycle variance. Likewise, inert gas substitution may be practiced with techniques discussed with any one (or part of any one or a combination of multiple ones) of the figures and/or with duty cycle variance and/or with frequency chirping. The point is although techniques are discussed individually and/or in connection with a specific figure, the various techniques can be combined in any combination in order to perform a particular process.

Although various examples are provided herein, it is intended that these examples be illustrative and not limiting with respect to the invention. Also, the title and summary are provided herein for convenience and should not be used to construe the scope of the claims herein. If the term "set" is employed herein, such term is intended to have its commonly understood mathematical meaning to cover zero, one, or more than one member. It should also be noted that there are many alternative ways of implementing the methods and apparatuses of the present invention.

What is claimed is:

1. A method for processing a substrate using mixed-mode pulsing, comprising:
   providing at least one plasma generating source;
   providing at least one reactive gas source for providing at least a first reactive gas into an interior region of a plasma processing chamber;
   providing at least one non-reactive gas source for providing at least a first non-reactive gas into the interior region of the plasma processing chamber;
   disposing a substrate on a work piece holder within the interior region;
   performing a mixed-mode pulsing (MMP) preparation phase, including flowing the first reactive gas into the interior region, wherein in the MMP preparation phase a first plasma is formed with at least the first reactive gas to process the substrate with the first plasma; and
   performing a mixed mode pulsing (MMP) reactive phase, including flowing at least the first non-reactive gas into the interior region, wherein in the MMP reactive phase a second plasma is formed with at least the first non-reactive gas to process the substrate with the second plasma, wherein the second plasma is formed with a flow of the first reactive gas during the MMP reactive phase that is less than a flow of the first reactive gas during the MMP preparation phase, wherein the plasma processing chamber is configured during the MMP reactive phase to generate non-reactive ions having a level of ion energy that is higher than required to etch an adsorbed layer on a surface of the substrate but insufficient to etch a non-adsorbed layer of the substrate, the adsorbed layer formed during the MMP preparation phase; and
   repeating the MMP preparation phase followed by the MMP reactive phase a plurality of times.

2. The method of claim 1, wherein no first reactive gas is flowed into the interior region during the MMP reactive phase.

3. The method of claim 1, wherein the at least one non-reactive gas source further comprises,
   a second non-reactive gas, and
   providing that the second non-reactive gas is flowed into the interior region during the MMP preparation phase.

4. The method of claim 1, further comprising,
   flowing a second reactive gas different from the first reactive gas into the interior region during the MMP reactive phase.

5. The method of claim 1, further comprising,
   providing that a first bias power is applied to the work piece holder during the MMP preparation phase and a second bias power having a different power level from a power level of the first bias power is applied to the work piece holder during the MMP reactive phase.

6. The method of claim 1, further comprising,
   providing that the power level of the second bias power is higher than the power level of the first bias power.

7. The method of claim 1, wherein no bias power is applied to the work piece holder during the MMP preparation phase.

8. The method of claim 7, wherein the bias power has a bias power level greater than zero when applied to the work piece holder during the MMP reactive phase.

9. The method of claim 8, wherein the bias power is pulsed during the MMP reactive phase.

10. A method for processing a substrate in a plasma processing chamber, the plasma processing chamber having a work piece holder, an internal region and at least one plasma generating source, the method comprising:
    (a) performing a mixed-mode pulsing (MMP) preparation phase, including flowing a first reactive gas into the interior region,
    exciting the first reactive gas, and
    forming a first plasma with at least the first reactive gas to process the substrate with the first plasma having more radicals than ions;
    (b) performing a mixed mode pulsing (MMP) reactive phase, including flowing at least a first non-reactive gas into the interior region, and
    forming a second plasma with at least the first non-reactive gas to process the substrate with the second plasma having more ions than radicals,
    wherein the second plasma is formed with a flow of the first reactive gas during the MMP reactive phase that is less than a flow of the first reactive gas during the MMP preparation phase; and
    (c) repeating steps (a) and (b) for a plurality of times.

11. The method of claim 10, wherein no first reactive gas is flowed into the interior region during the MMP reactive phase.

12. The method of claim 10, wherein no bias power is applied to the work piece holder during the MMP preparation phase.

13. The method of claim 10, wherein the at least one non-reactive gas source further comprises,
    a second non-reactive gas, and
    providing that the second non-reactive gas is flowed into the interior region during the MMP preparation phase.

14. The method of claim 10, further comprising,
    flowing a second reactive gas different from the first reactive gas into the interior region during the MMP reactive phase.

15. The method of claim 10, wherein the plasma processing chamber is configured during the MMP reactive phase to generate non-reactive ions having a level of ion energy that is higher than required to etch an adsorbed layer on a surface of the substrate.

16. The method of claim 15, wherein the level of ion energy is insufficient to etch a non-adsorbed layer of the substrate, the adsorbed layer formed during the MMP preparation phase.

17. The method of claim 10, wherein a bias power has a bias power level greater than zero when applied to the work piece holder during the MMP reactive phase.

18. The method of claim 17, wherein the bias power is pulsed during the MMP reactive phase.

19. The method of claim 10, further comprising,
providing that a first bias power is applied to the work piece holder during the MMP preparation phase and a second bias power having a second power level that is different from a first power level of the first bias power that is applied to the work piece holder during the MMP reactive phase.

20. The method of claim 19, further comprising,
providing that the second power level of the second bias power is higher than the first power level of the first bias power.

\* \* \* \* \*